United States Patent [19]

Kawashima

[11] 3,845,473

[45] Oct. 29, 1974

[54] PULSE SIGNAL TRANSMITTER AND RECEIVER

[75] Inventor: Kazumi Kawashima, Osaka, Japan

[73] Assignee: Matsushita Electric Industrial Co., Ltd., Osaka-fu, Japan

[22] Filed: Dec. 7, 1972

[21] Appl. No.: 312,971

[30] Foreign Application Priority Data

| | | |
|---|---|---|
| Dec. 7, 1971 | Japan | 46-99300 |
| Dec. 30, 1971 | Japan | 46-4573 |
| Dec. 30, 1971 | Japan | 46-4574 |
| Dec. 30, 1971 | Japan | 46-4575 |

[52] U.S. Cl. .......................... 340/167 R, 340/365 S

[51] Int. Cl. .............................................. H04q 5/14

[58] Field of Search ...................... 340/365 S, 167 R

[56] References Cited

UNITED STATES PATENTS

| | | | |
|---|---|---|---|
| 3,576,433 | 4/1971 | Lee | 340/365 S |
| 3,597,538 | 8/1971 | Binenbaum | 340/365 S |
| 3,750,160 | 7/1973 | Elzinga | 340/365 S |

*Primary Examiner*—Harold I. Pitts

[57] ABSTRACT

A code entered by depressing a key, on a keyboard is converted into a binary code and stored in a memory, and in response to the depression of the key a pulse generator starts oscillation and the output pulses are counted by a counter. When the content in the counter coincides with that in the memory, a comparator gives the coincidence signal in response to which the pulse generator is de-energized. In response to the pulses from the pulse generator, an oscillator starts oscillation at a frequency considerably higher than the repetitive frequency of the pulses for a time interval equal to the pulse duration so that the pulse modulated signal is transmitted. The transmitted signal is received by a receiver in which the pulses contained in the signal are counted and converted into a binary code for storage. A controlled device is controlled in response to the binary code read out.

14 Claims, 22 Drawing Figures

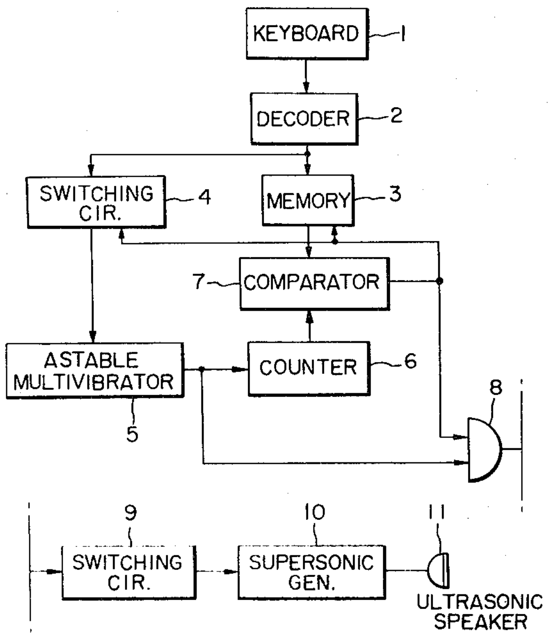

FIG. 5A
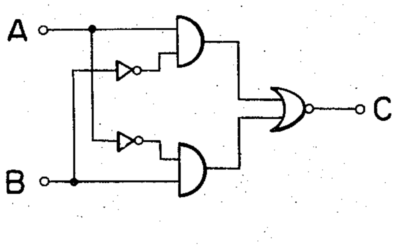
FIG. 5B
| A | B | C |
|---|---|---|
| L | L | H |
| L | H | L |
| H | L | L |
| H | H | H |
FIG. 6A
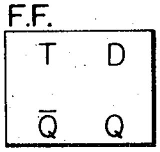
FIG. 6B
| tn | tn+1 |
|---|---|
| D | Q |
| L | L |
| H | H |
FIG. 6C
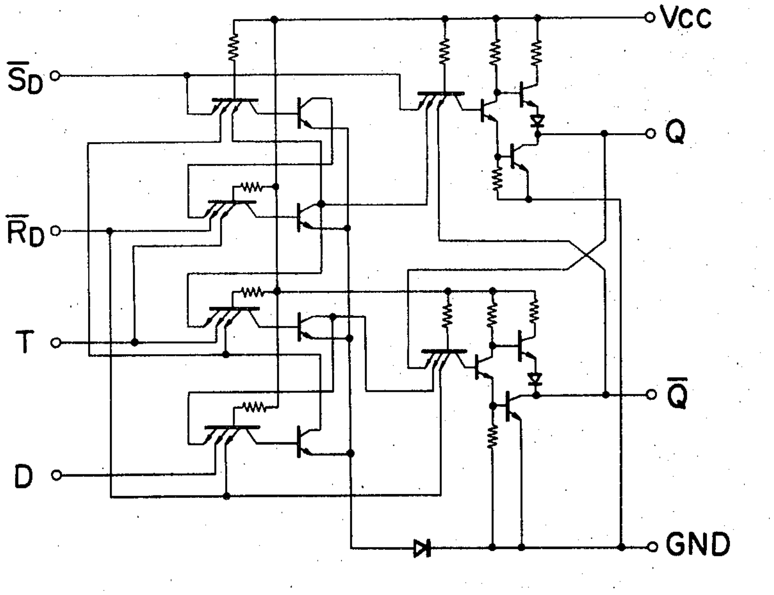

PULSE SIGNAL TRANSMITTER AND RECEIVER

BACKGROUND OF THE INVENTION

The present invention relates to a pulse signal transmitter and receiver best suited for use in a remote control system for controlling for example a television receiver.

The prior art pulse signal transmitters and receivers used in the remote control systems were generally complex in construction and unreliable in operation.

SUMMARY OF THE INVENTION

One of the objects of the present invention is therefore to provide a pulse signal transmitter and receiver which are both simple in construction.

Another object of the present invention is to provide a pulse signal transmitter and receiver which are very reliable and dependable in operation and can eliminate any erratic operation.

Briefly stated in accordance with the present invention, a code which is selected and entered by depressing a corresponding key on a keyboard is converted into a binary code and is stored in a memory. In response to the depression of the key, a pulse generator starts oscillation and the output pulses are counted by and stored in a counter. When the content in the counter coincides with the content in the memory, a comparator gives the coincidence signal in response to which the pulse generator is de-energized. In response to the pulses delivered from the pulse generator, an oscillator starts oscillation at a frequency considerably higher than the repetitive frequency of the pulses for a time interval equal to the pulse duration or width, thereby transmitting the pulse modulated signal. In a receiver the number of pulses received are counted and the converted into a binary code for storage. A controlled device is controlled in response to this binary code read out.

The pulse signal transmitter and receiver in accordance with the present invention may be used not only for selecting a television channel but also for adjusting the contrast, brightness and so on of a television receiver. For this purpose the pulse signal transmitter further comprises an oscillator capable of oscillating at one of a plurality of different frequencies whereas the pulse signal receiver further comprises a frequency discriminator capable of the frequency of the transmitted signal. Each of a plurality of controlled devices is controlled only in response to a specific frequency used to transmit the signal.

The above and other objects, features and advantages of the present invention will become more apparent from the following description of the preferred embodiments thereof taken in conjunction with the accompanying drawing.

BRIEF DESCRIPTION OF THE DRAWINGS

FIG. 5A is a diagram of a logic circuit component used in a comparator used in the transmitter shown in FIGS. 1 and 3;

FIG. 5B is a truth table used for the explanation theeof;

FIGS. 6A and 6B are a view and a truth table used for the explanation of a D type flip-flop used in a memory in the transmitter;

FIG. 6C is a detailed circuit diagram thereof;

DESCRIPTION OF THE PREFERRED EMBODIMENTS

Figure 1:
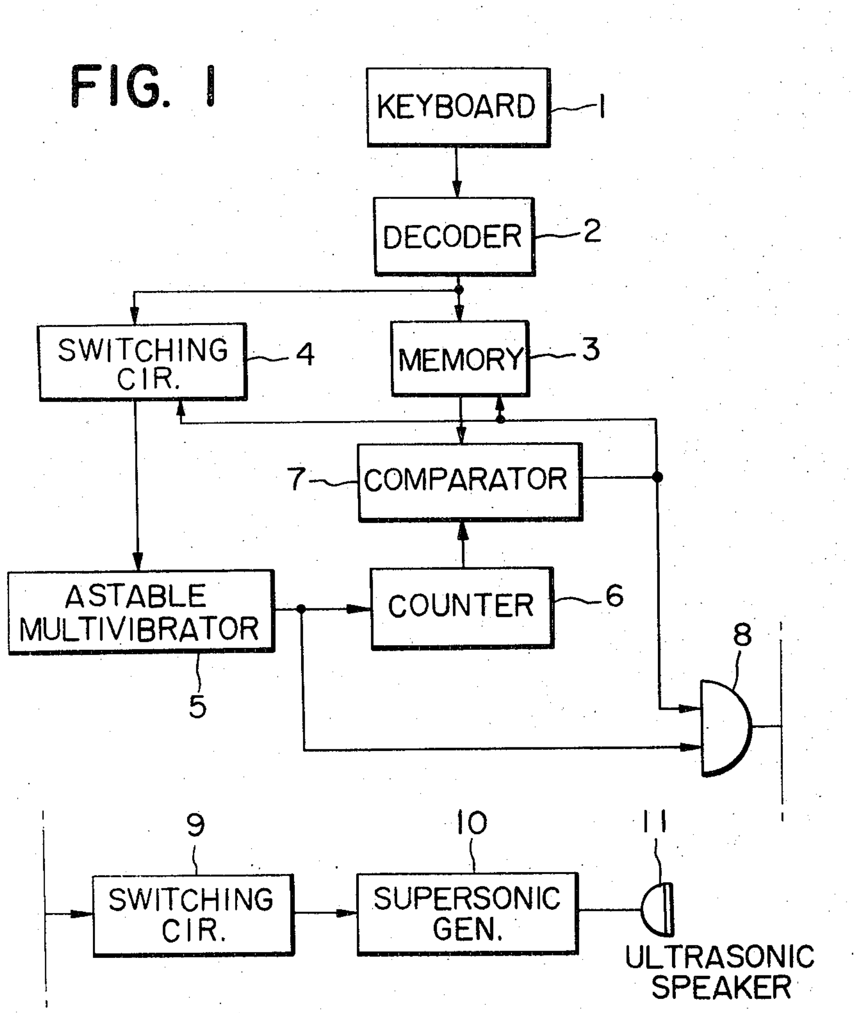
FIGS. 1 and 2 are block diagrams of a first embodiment of a signal pulse transmitter and receiver in accordance with the present invention.

Referring to FIG. 1, a pulse signal transmitter generally comprises a keyboard 1, an encoder 2 for converting a decimal number entered by the keyboard 1 into a binary coded signal; a memory 3 comprising flip-flops for storing therein the binary coded signal fro the encoder 2; a switching circuit 4 actuable in response to the depression of a key on the keyboard 1; an astable multivibrator 5 which starts oscillation in response to the output signal from the switching circuit 4; a counter 6 for counting the pulses from the astable multivibrator 5; a comparator 7 for comparing the content in the counter 6 with that in the memory 3 and generating the coincidence signal when they are coincident with each other; an AND gate 8; a switching circuit 9 for turning on a power source for a ultrasonic generator 10; and a ultrasonic speaker 11.

Figure 2:
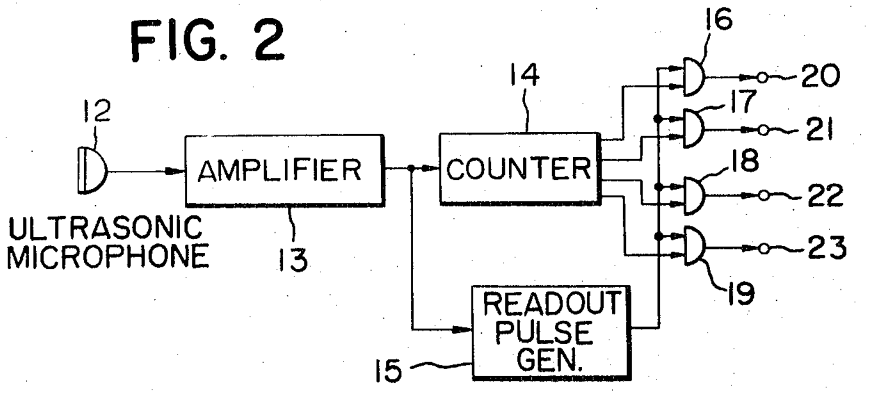

Referring to FIG. 2, a receiver in accordance with the present invention is shown as comprising a ultrasonic microphone 12 for receiving the signals transmitted from the ultrasonic speaker 11 of the transmitter; an amplifier 13 for amplifying the input signals; a counter 14 for counting the received pulses and storing them in the form of a binary coded signal; a readout pulse generator 15 for reading out the content in the counter 14; AND gates 16, 17, 18 and 19 and output terminals 20, 21, 22 and 23 from which may be derived the received signal which is now converted into a binary coded signal.

FIGS. 3A and 3B show a more practical circuit diagram of the transmitter shown in block diagram in FIG. 1. The pulse signal transmitter-receiver in accordance with the present invention is shown as being applied to an automatic television channel selector. Numerals 0 – 9 in the keyboard 1 designate the television channels. Reference numeral 24 denotes an inverter; 25 – 28, D type flip-flops in the memory 3; 29, 30 and 31, an RS flip-flop, an AND gate and a switching transistor in the switching circuit 4; 32 – 35, flip-flops in the counter 6; 36 – 39, logic circuit components in the comparator 7; 40, an AND gate and 41, an inverter.

Figure 4:
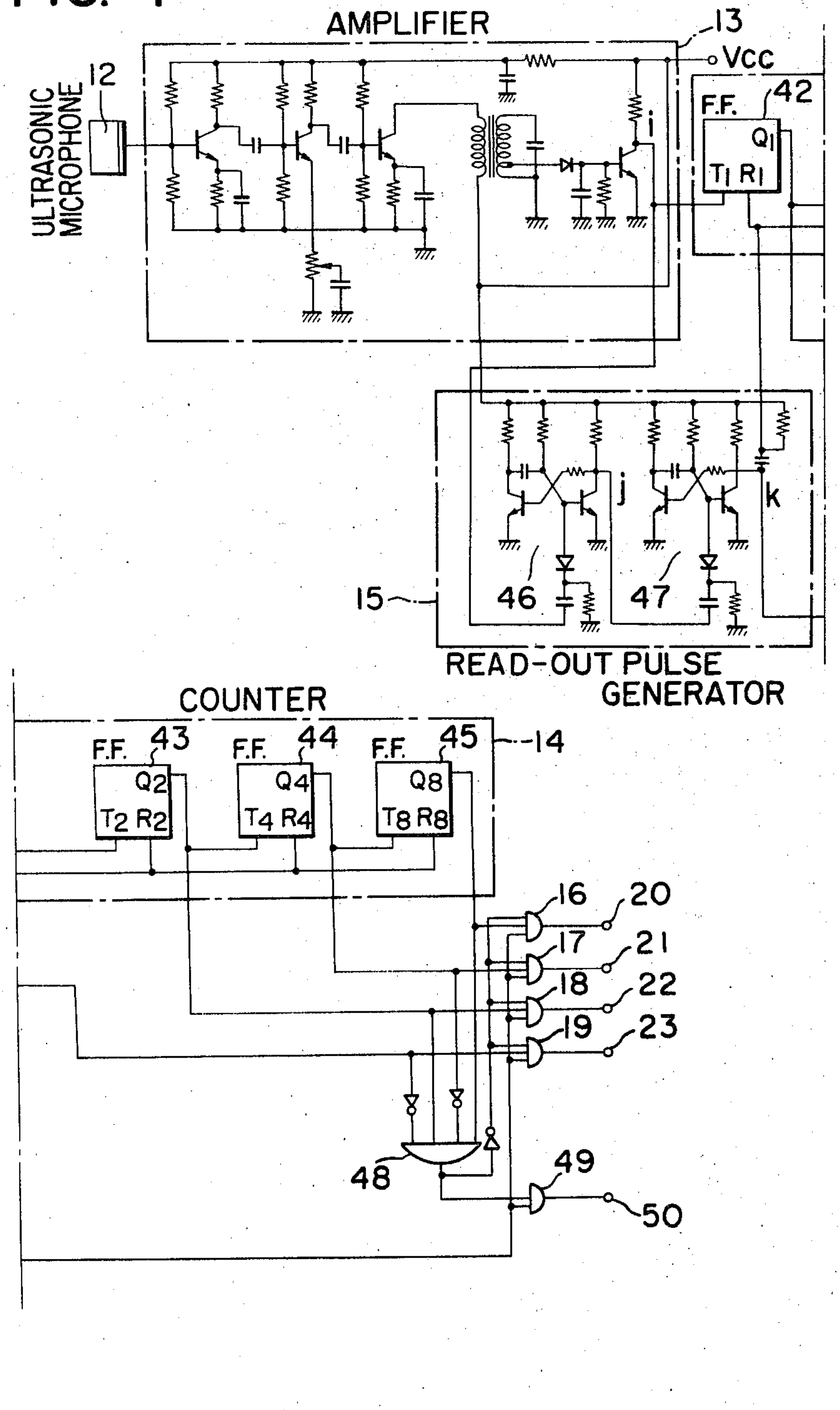

FIG. 4 shows a practical circuit diagram of the receiver shown in block diagram in FIG. 2, in which 42 – 45 denote flip-flops in the counter; 46, and 47, monostable multivibrators in the readout pulse generator 15; 48 and 49, AND gates and 50, an output terminal. The width of the pulses generated by the monostable multivibrator 46 is set to a time slightly longer than a time required for permitting the counter 14 to count all of the pulses received. In the instant embodiment, the width is set to ten times of the width of pulses generated by the astable multivibrator 5 in the transmitter.

The arrangement of each of the logic circuit components in the comparator is shown in FIG. 5A and its logic function is shown in the truth table in FIG. 5B, in which A and B denote the input terminals; C, an output terminal; H, a high level and L, a low level.

Arrangement of the D type flip-flop used in the memory 3 is shown in FIG. 6A and its truth table is shown in FIG. 6B. A practical circuit is shown in FIG. 6C in which T denotes a trigger input terminal; D, a data input terminal; and Q and $\overline{Q}$, output terminals. In the truth table shown in FIG. 6B $t_n$ denotes a bit time immediately before a clock pulse is impressed whereas $t_{n+1}$, a bit time after the clock pulse is impressed. In an RS flip-flop R denotes a reset signal input terminal whereas S, a set signal input terminal.

The suffixes attached to the symbols A, B, C, T, and so on denote "memory", "counter" or "binary numbers to be compared to each other."

Figure 7:
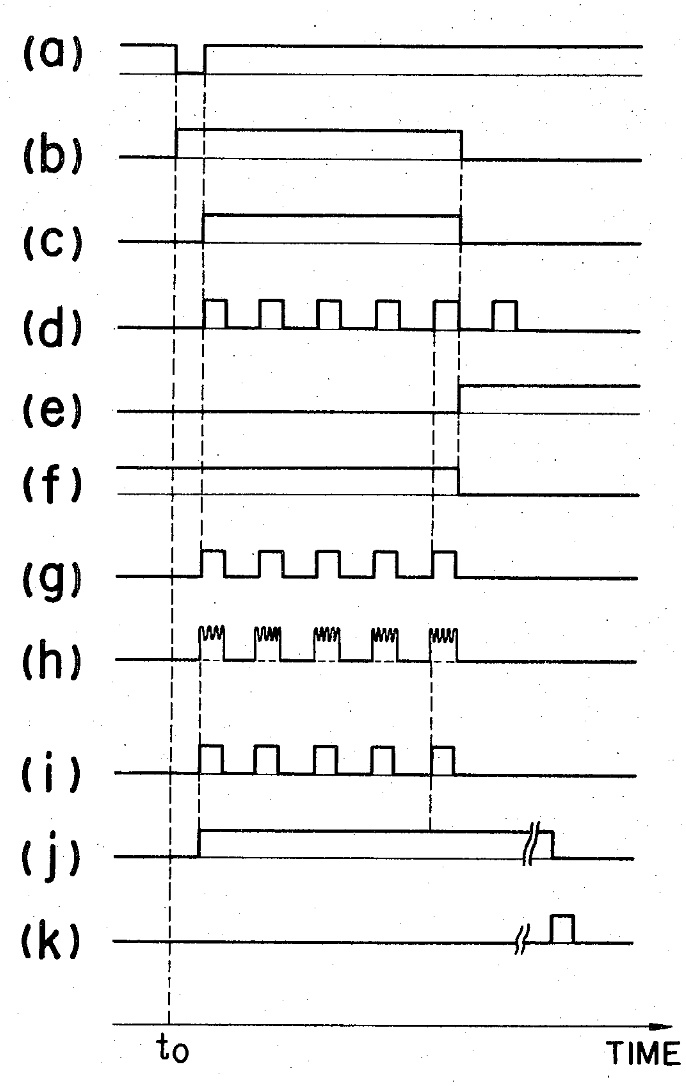
FIG. 7 shows various waveforms of the signals at the points *a–k* in the circuit diagrams shown in FIGS. 3A, 3B and 4.

Next referring to FIG. 7 illustrating the waveforms of the various signals at the specific points *a–k* in the circuits shown in FIGS. 3 and 4, the mode of operation will be described. It is assumed that the channel 5 be selected by the keyboard 1 at time $t_0$. Then the output a of the inverter 24 becomes L whereas the output of the keyboard 1 is converted into the binary signal by the encoder 2 and is stored in the memory 3. That is, the output terminals of the flip-flops 25 and 27 in the memory 3 are held at high level H. Simultaneously the RS flip-flop makes a transition so that its output becomes H. As soon as the output of the inverter 24 is reversed, the switching transistor 31 is conductive so that the astable multivibrator 5 starts oscillation. (See FIG. 7(*d*).)

The pulses from the astable multivibrator 5 are counted by the counter 6 and when the content in the counter 6 coincides with that in the memory 3, the corresponding logic circuit component in he comparator 7 gives the output H. In this embodiment, when the five pulses have been counted by the counter 6, all of the corresponding outputs of the flip-flops in the counters 6 and the memory 3 coincide with each other so that the coincidence signal is generated. Therefore the output e of the AND gate 40 becomes H whereas the output of the inverter 41 becomes L so that the RS flip-flop 29 is reset. As a consequence the astable multivibrator 5 stops oscillation. The AND gate 8 is inserted in order to prevent the erractic operation. That is, even when the astable multivibrator 5 fails to immediately stop its oscillation in response to the L output of the inverter 41 which inverts the AND signal of the AND gate 40 as shown in FIG. 7*d*, the AND gate 8 permits the passing of only five pulses as shown in FIG. 7*g*. Only when these five pulses are applied to the switching transistor 9 through the AND gate 8, the switching transistor 9 is rendered conductive so as to actuate the ultrasonic generator 10. Therefore the ultrasonic waves modulated by the pulses as shown in FIG. 7*h* are applied to the ultrasonic speaker 11.

In summary in response to the output of the comparator 7, the output pulses of the astable multivibrator 5 may be permitted to pass through the AND gate 8 in number equal to the number of pulses stored in the memory 3 to the switching transistor 9 so that the circuit may be made simple in construction and free from the erratic operation.

Next referring to FIGS. 4 and 7, the pulse signals as shown in FIG. 7*h* are received by the ultrasonic microphone 12 and amplified and detected by the amplifier 13 so as to give the output signals as shown in FIG. 7*i* from the transistor in the last stage. The output pulses are counted by the counter 14 and stored therein as a binary coded signal. In response to the readout pulse (See FIG. 7*k*) of the readout pulse generator 15 which is the output H of the monostable multivibrator 47 which makes a transition in response to the trailing edge of the output pulse signal (See FIG. 7*j*) of the monostable multivibrator 46, the binary coded signal stored in the counter 14 is derived through the AND gates 16 – 19 from the output terminals 20 – 23. Thereafter in response to the trailing edge of the output pulse (See FIG. 7*k*) of the monostable multivibrator 47, the counter 14 is reset.

In the instant embodiment, the channel 0 is represented by ten pulses. When the channel 0 is selected, the flip-flops 43 and 45 in the counter 14 give the outputs H whereas the flip-flops 42 and 44 give the outputs L so that the output of the AND gate 48 becomes H. Therefore the output representing the channel 0 is derived not from the output terminals 20 – 23 but from the output terminal 50. It should be noted that in the instant embodiment no signal is derived from the output terminal 50 unless the channel 0 is selected and that if the selection of channel 0 is not required the AND gate 49 and the output terminal 50 may be eliminated. The explanation of the channel selection other than channel 5 and 0 described above will not be made in this specification as it will be apparent to those skilled in the art from the foregoing description.

The mode of operation of the pulse signal transmitter in accordance with the present invention may be summarized as follows: A signal representing for example a decimal number which is entered by the keyboard is converted into a binary coded signal by the encoder and then stored in the memory. The output pulses of the astable multivibrator which is actuated immediately when the signal is entered are counted by the counter and when the content in the counter coincides with that in the memory the comparator gives the coincidence signal so that the AND gate is opened to pass successively the number of pulses stored in the memory. The pulses from the AND gate are transmitted by the transmitter means. Thus a variety of signals may be correctly transmitted over one assigned frequency so that various function of the controlled device coupled to the receiver may be remote-controlled without any erratic operation in a very reliable and dependable manner. Furthermore a series of pulses are processed mainly in the pulse generator, the comparator and the counter so that the transmitter in accordance with the present invention may be made compact in size and free from erratic operations. The pulse signal transmitter and receiver in accordance with the present invention are particularly advantageous when they are applied in the remote control system for selecting the channels of a television receiver.

Figure 3:
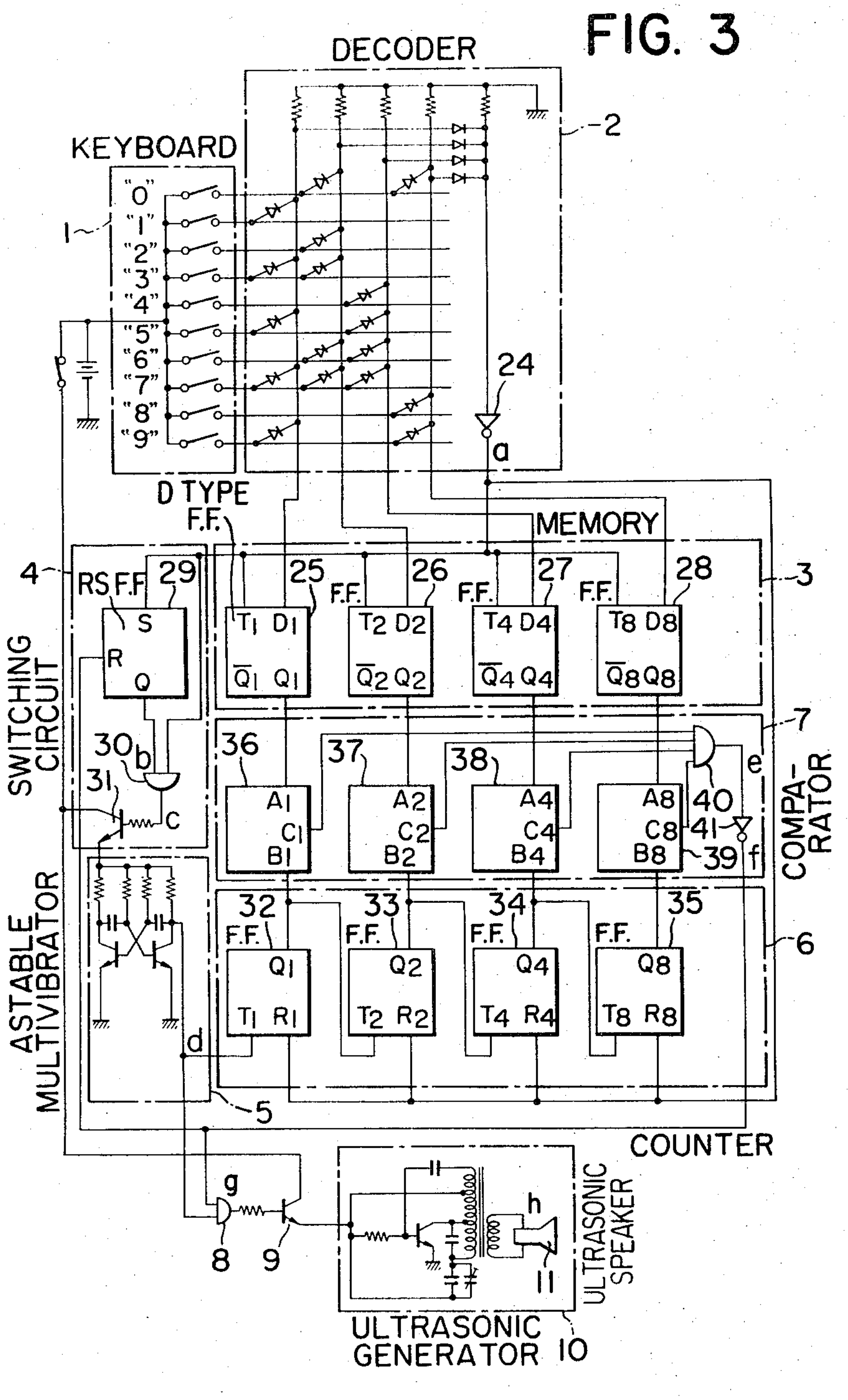
FIGS. 3A, 3B and 4 are detailed circuit diagrams thereof.
Figure 8:
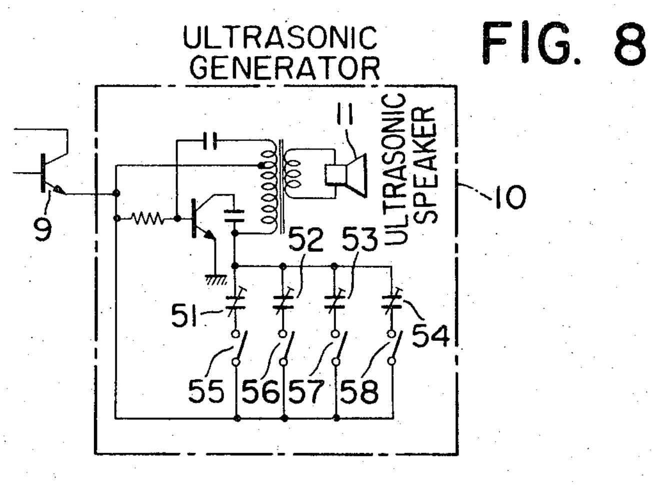
FIG. 8 is a circuit diagram of an ultrasonic generator used in a variation of the transmitter shown in FIGS. 1 and 3.

In order to control the volume and to adjust the color of a television receiver by a remote control system, the ultrasonic generator 10 shown in FIG. 3 may be modified as shown in FIG. 8. A plurality of capacitors 51, 52, 53 and 54 are arranged so as to be selected by frequency selection switches 55, 56, 57 and 58 so that a variety of remote controls may be effected by varying the frequency of the conlrol signals.

Figure 10:
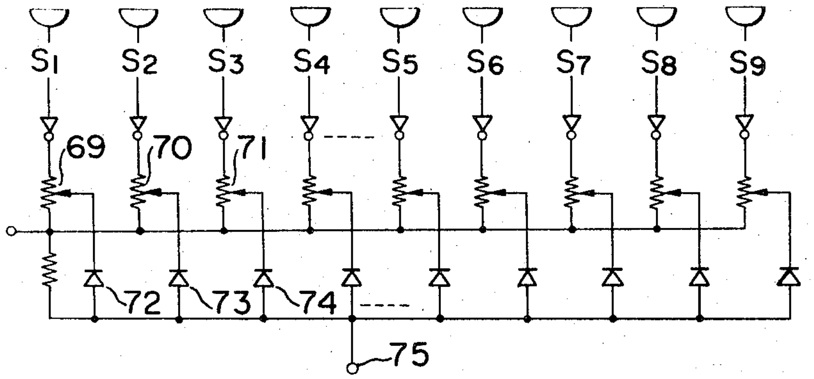
FIG. 10 is a diagram of a circuit to be coupled to the pulse signal receiver shown in FIGS. 9A to 9C.
Figure 9A:
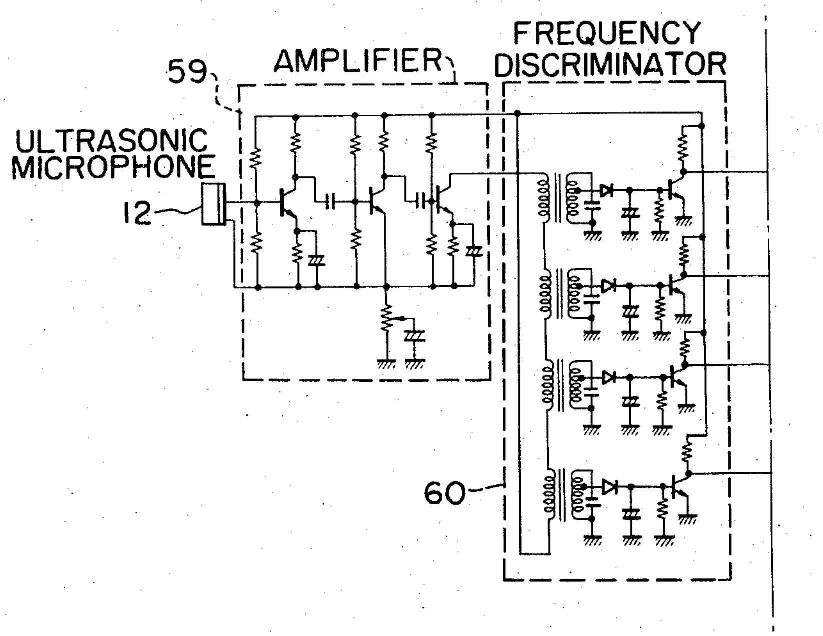
FIGS. 9A to 9C show a circuit diagram of a pulse signal receiver adapted to receive the signal from the pulse signal transmitter a part of which is shown in FIG. 8.
Figures 9A, 9B, 9C:
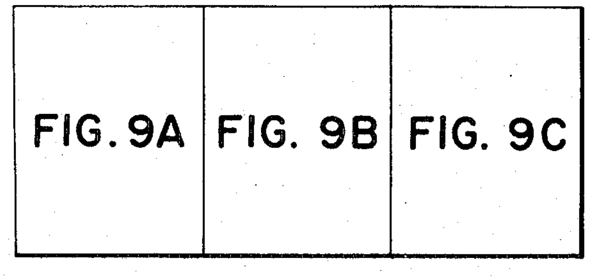
Figure 9B:
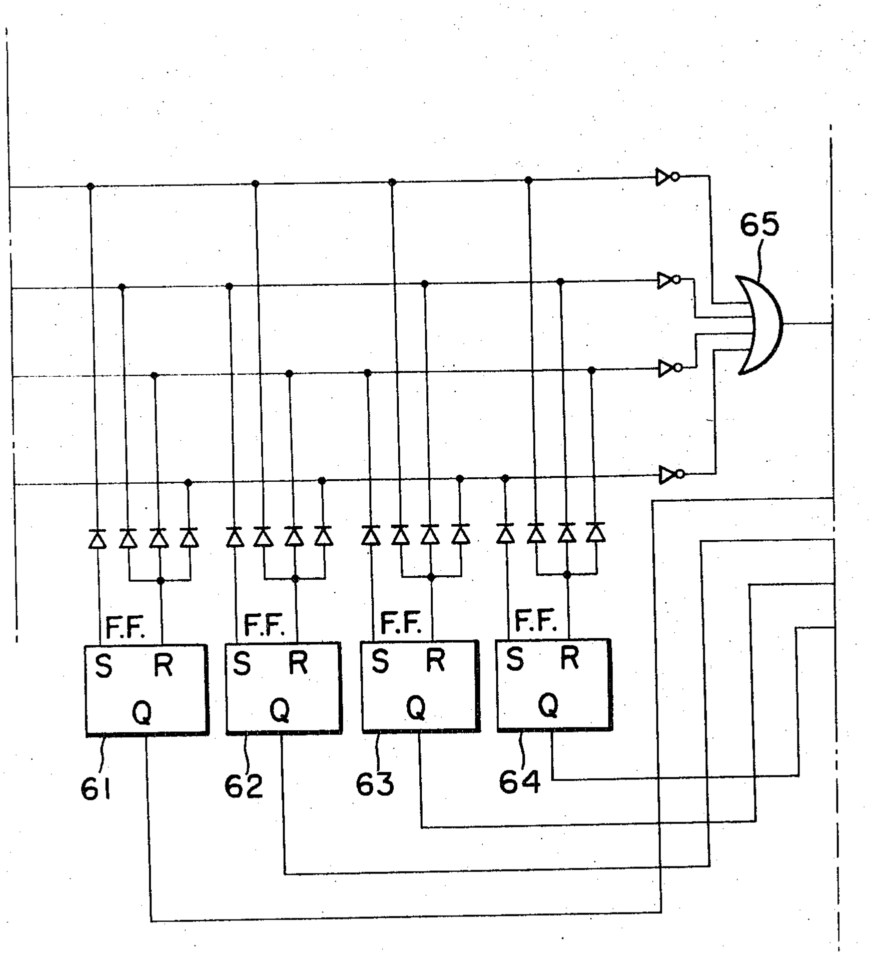
Figure 9C:
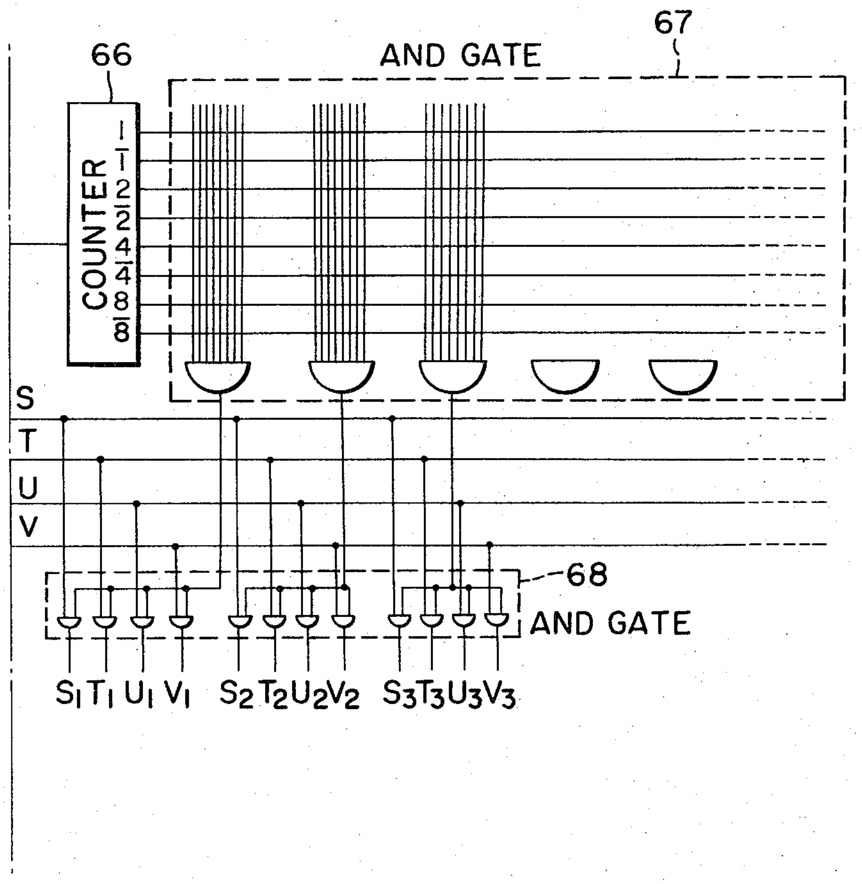

FIGS. 9A to 9C show a circuit diagram of a receiver adapted to receive the pulse signals transmitted over four different assigned frequencies from the transmitter incorporating the ultrasonic generator shown in FIG. 8. The received signal is amplified by an amplifier 59 and the frequency of the received signal is discriminated, detected and rectified by a frequency discriminator 60. The discriminated frequency is stored in the form of a binary code by a plurality of set-reset flip-flops 61 – 64. The pulse components are transmitted through an OR gate 65 to a counter 66 where they are counted and stored. The pulse counter 66 is adapted to reset in response to the first pulse and to start counting from the second pulse. The binary coded signal stored in the counter 66 is converted into a decimal digit signal by 8-terminal AND gates 67. The outputs S, T, U and V of the flip-flops 61 – 64 representing the frequency components and the outputs of the AND gates 67 are applied to AND gates 68 to derive a control signal $S_n$, $T_n$, $U_n$ or $V_n$ where $n$ is a decimal number entered on the keyboard 1 of the transmitter. For example the signals $S_1$ – $S_9$ are assumed to be used to control the volume level. In a volume control circuit shown in FIG. 10, each of variable resistors 69, 70, 71 and so on is set to exhibit a predetermined resistance, and diodes 72, 73, 74 and so on for preventing the reverse current are inserted into the sliding arms of the variable resistors. When one of the outputs $S_1$ – $S_9$ reaches a high level, the current flows through the corresponding variable resistor so that the voltage of a predetermined level may be derived from a common output terminal 75 for controlling the volume.

It will be apparent to those skilled in the art that the signals $T_1$ – $T_9$ and $U_1$ – $U_9$ may be used to control or adjust the contrast and brightness in a manner substantially similar to that described above.

From the foregoing description it will be understood that by the combinations of the number of pulses and the assigned frequency selected and entered by the keyboard, the volume, brightness, contrast, hue and color may be adjusted very rapidly but independently of each other. For example the volume level may be varied depending upon the number of pulses transmitted over the frequency assigned for volume control.

Figure 11:
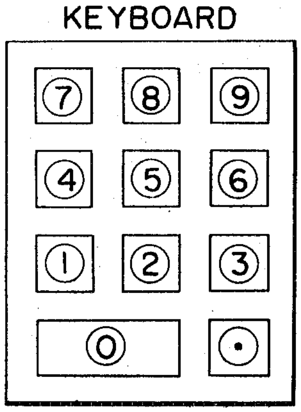
FIG. 11 is a schematic top view of a keyboard used in conjunction with another embodiment of a pulse signal transmitter and receiver in accordance with the present invention.

Next will be described the arrangement for selecting a desired channel and controlling a power ON-OFF switch, volume, contrast and brightness of a television receiver by a common keyboard shown in FIG. 11. In the instant embodiment, the key ○ is used to control the power ON-OFF switch, and the keys ①, ② and ③ are used to control the volume level. The keys ④, ⑤ and ⑥ are used to adjust the contrast whereas the keys ⑦, ⑧ and ⑨, to control the brightness.

First the mode of volume control will be described. The volume control system is so arranged that when the key ③ is depressed the volume level is gradually increased and held at a desired level when the key ② is depressed. In a similar manner when the key ① is depressed the volume level is gradually decreased and is held at a desired level when the key ② is depressed. When the key ○ is depressed while the ON-OFF switch is closed, the latter is opened, and vice versa.

When a key is selected and depressed on the keyboard the corresponding number of pulses is derived from the output of the AND gate 8 in the pulse modulated signal transmitter.

Figure 12:
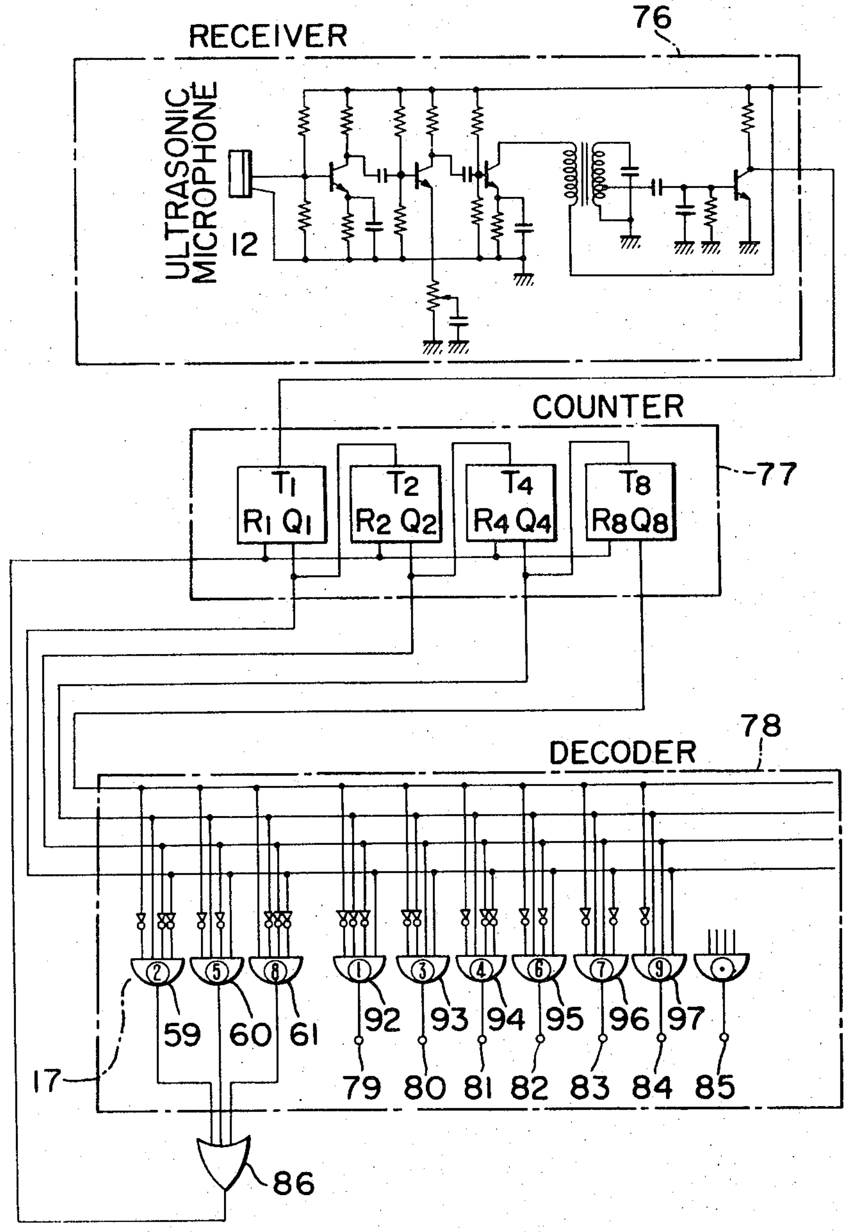
FIG. 12 is a circuit diagram of a receiver adapted to receive the signal transmitted from the transmitter using the keyboard shown in FIG. 11.

The signal received at the microphone 12 in a receiver shown in FIG. 12 is amplified, detected and rectified by an amplifier 76 only to derive the pulse components which are counted by a counter 77. The output of the counter 77 is applied to a decoder 78 so as to derive the output from one of its output terminals 79 – 85.

In the instant embodiment, the keys such as ②, ⑤ and ⑧ in the middle row are used as "stop" keys because it is rather easier to depress these keys for an operator than other keys. When one of these keys is depressed, a reset output signal is derived from an output terminal of an OR gate 86 so that the counter 77 is reset. The output signals derived from the output terminals 79 – 85 may be used to control the volume, the brightness, contrast and ON-OFF of the television receiver.

Figure 13:
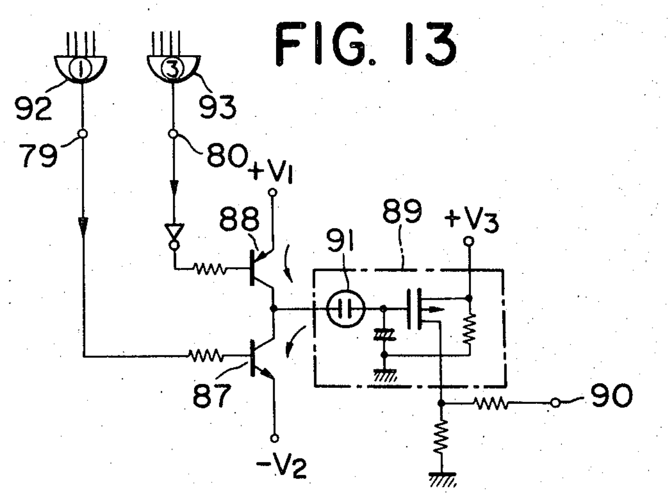
FIG. 13 is a diagram of a circuit adapted to be coupled to the receiver shown in FIG. 12.
Figure 14:
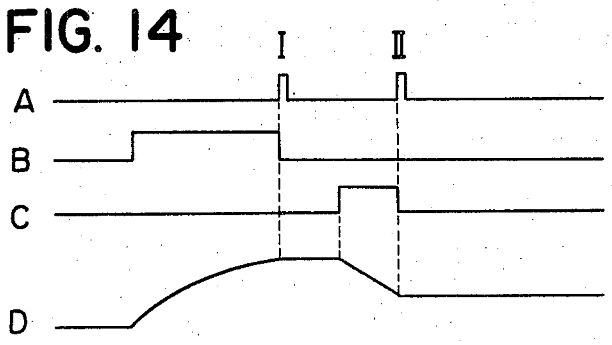
FIG. 14 is a view used for the explanation of the circuit shown in FIG. 13.

Referring to FIG. 13, when the output signal appears on the output terminal 79, a transistor 87 is rendered conductive. In a similar manner when the output signal appears at the output terminal 80, a transistor 88 is rendered conductive. In this manner the charging and discharging of an analog memory 89 may be effected. This mode of operation will be described in more detail with reference to FIG. 14 in which the waveforms A, B, C and D represent the outputs at the output terminal of the OR gate 86, and the terminals 80 and 79 and 90 respectively. Upon depression of the key ③ the output signal appears at the output terminal 80 so that the transistor 88 is rendered conductive to charge the analog memory 89 comprising a Miller Integrator with a voltage $+V_1$. When the key ② is depressed at a time I the voltage is maintained at the level when the key ② is depressed and the output voltage remains at this level. When the key ① is depressed the transistor 87 is rendered conductive so that the charges stored in the analog memory 89 are discharged. When the key ② is depressed at a time II, the voltage level when the key ② is depressed may be maintained. The voltage signal derived from the output terminal 90 may be used to control the volume, the brightness, the contrast, the hue, the color or the like.

Figure 15:
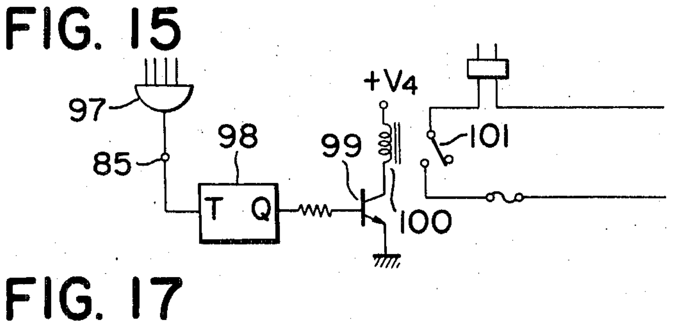
FIG. 15 is a diagram of another circuit adapted to be coupled to the receiver shown in FIG. 12.

Next referring to FIG. 15 the mode of operation of the ON-OFF switch of the television receiver will be described. When the output signal appears at the output terminal 97 (See FIG. 12), a flip-flop 98 make a transition so that a switching transistor 99 is conducted so as to energize a relay 100 thereby controlling the ON-OFF operation of the switch 101.

In summary according to the present invention the keys on the keyboard upon depression each of which is generated the corresponding number of pulses are divided into a plurality of key groups according to their functions so that the signal generated when one of the keys belonging to the same key group is depressed may be used to control a plurality of controlled devices. Therefore only one frequency is required to remotely control a plurality of controlled devices such as a volume control, a color control a brightness control and the like of a television receiver.

Figure 17:
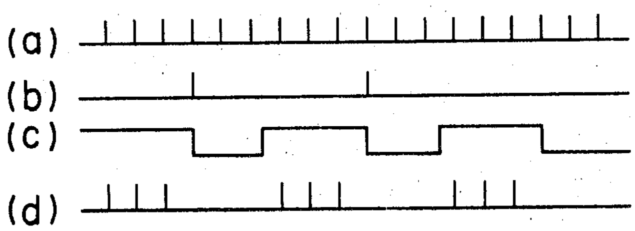
FIG. 17 shows the waveforms used for explanation thereof.
Figure 16:
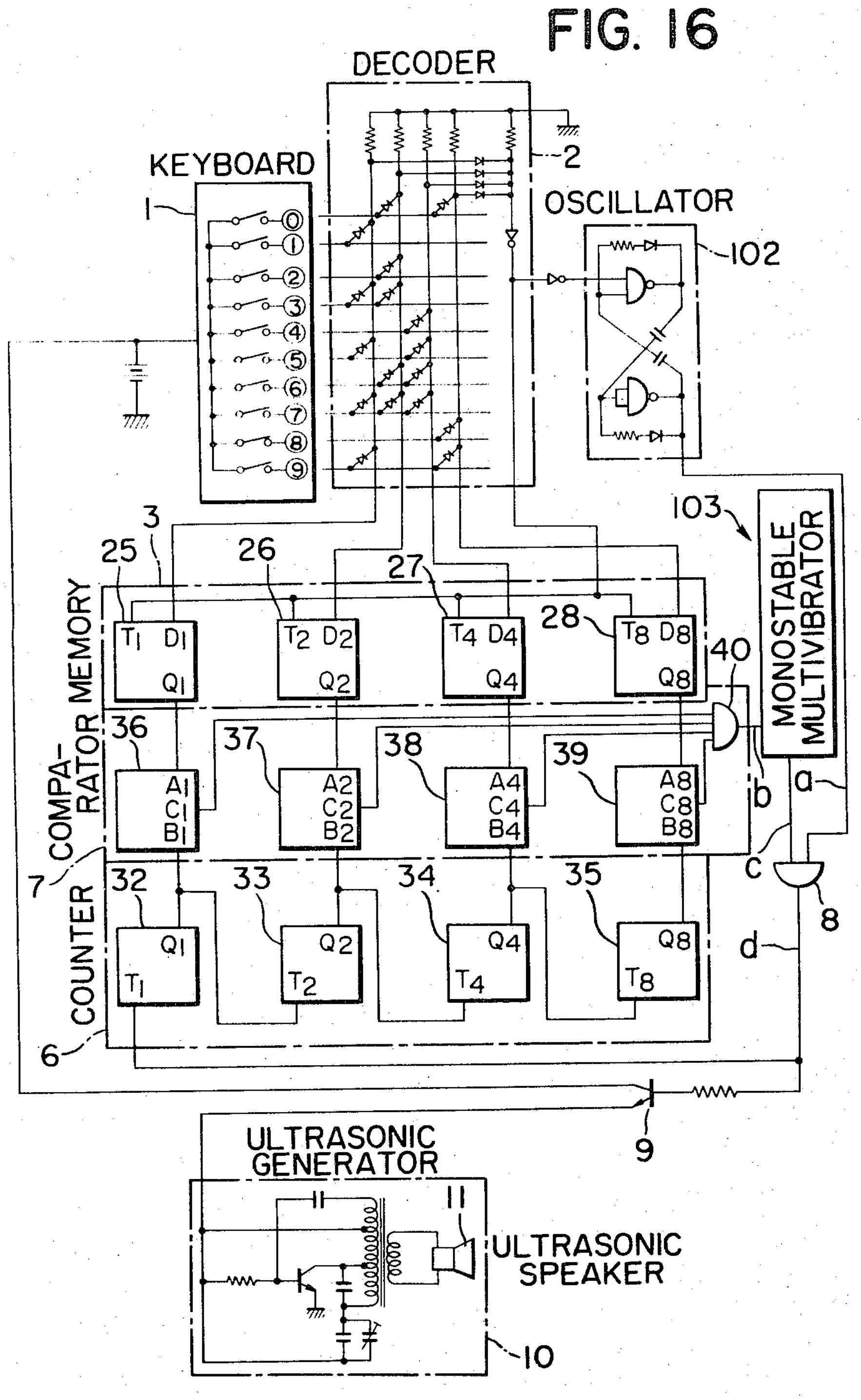
FIGS. 16A and 16B show a circuit diagram of a still another embodiment of the transmitter in accordance with the present invention.

In a variation of a transmitter in accordance with the present invention shown in FIGS. 16A and 16B, instead of the astable multivibrator 5, the RS flip-flop 29, the AND gate 30 and the transistor 31 in the transmitter shown in FIG. 3, an oscillator 102, and a monostable multivibrator 103 are used. The oscillator 102 is actuated in response to the output of the decoder 2, and starts oscillation in response to the depression of any key on the keyboard 1 as shown in FIG. 17*a*. The monostable multivibrator 103 is actuated in response to the output of the AND gate 40 so as to generate the signal as shown in FIG. 17*c*. In response to the output (See FIG. 17*c*) the outputs of the oscillator 102 (See FIG. 17*a*) pass through the AND gate 8 as shown in FIG. 17*d* so as to render the switching transistor 9 conductive.

What is claimed is:

1. A pulse signal transmitter comprising a. means for manually selecting a desired code, b. means for converting said selected code into a binary code, c. means for storing said binary code, d. pulse generator means actuable in response to the code selection by said code selection means for producing a series of pulses, e. counter means connected to count the pulses from said pulse generator means, f. comparator means connected to said counter means and storing means for producing a coincidence signal when the content in said counter means coincides with that in said storing means, g. means for inhibiting further output pulses of said pulse generator means in response to said coincidence signal, and h. means for modulating and transmitting the pulses produced by said pulse generator means.

2. A pulse signal transmitter as defined in claim 1 wherein said modulating and transmitting means comprises an oscillator adapted to oscillate at a frequency considerably higher than the repetitive frequency of the pulses from said control means for a time interval equal to the pulses duration thereby modulating said pulses.

3. A pulse signal transmitter as defined in claim 1 wherein said inhibiting means comprises means for deenergizing said in response to said coincidence signal from said comparator means.

4. A pulse signal transmitter as defined in claim 2 wherein said pulse generator means comprises an astable multivibrator and gate means for passing the output pulses of said pulse generator in response to the output of said astable multivibrator, said output of said multivibrator comprising a gating signal.

5. A pulse signal transmitter as defined in claim 2 wherein said oscillator means includes switching means for permitting said oscillator means to oscillate at one of a plurality of predetermined frequencies.

6. A pulse signal transmitter as defined in claim 4 wherein said gate means comprises an AND circuit connected to provide output when the output of said pulse generator means and said coincidence signal of said comparator means are simultaneously applied thereto so that said oscillator means may be energized only in the presence of said output of said AND circuit.

7. A pulse signal receiver adapted to receive a pulse signal transmitted from a transmitter comprising a. a microphone adapted to receive said modulated pulse signal from said transmitter, b. a plurality of frequency discriminator means for detecting the output of said microphone, c. means for counting and storing the output pulses from said plurality of frequency discriminator means, d. means for converting the output of said counting and storing means into a decimal number, and e. a plurality of AND gate means and means applying the outputs of said converter means and of said plurality of frequency discriminator means to said AND gate means as inputs.

8. A pulse signal receiver as defined in claim 7 comprising a variable resistor, wherein one end of said variable resistor is connected to each of the output terminals of said plurality of AND gate means so as to impress thereon a predetermined voltage, the other end of said variable resistor being connected through a resistor to a common output terminal, and a diode inserted between a sliding arm of said last mentioned resistor and said common output terminal in order to prevent reverse current flow.

9. A pulse signal receiver as defined in claim 7 wherein said counting and storing means is set in response to the first pulse from said detector means and is adapted to count and store pulses after the occurrence of said first pulse.

10. In a pulse signal transmitter and receiver system of the type including a pulse signal transmitter capable of transmitting the energy of an oscillator for oscillating a continuous wave modulated by coded pulses, a receiver by way of a radiator means, for the purpose of remotely controlling a number of functions in said receiver, and a pulse signal receiver capable of receiving said transmitted energy from said pulse transmitter, and of converting said coded pulses into a control for controlling said functions of said receiver; the improvement wherein said pulse signal transmitter comprises:

a. a code selector means for selecting a desired code, b. a decoder means for converting the code selected by said code selector means into a binary code, c. a memory means for storing said binary code derived from an output of said decoder, d. a pulse generator means connected to be actuated in response to the code selected by said code selector means, e. a counter means connected to count the number of the pulses from the output of said pulse generator means, f. a comparator means connected to provide a coincidence signal when the contents in said counter means coincide with that in said storing means by comparing both of said contents, g. a gate means, using the output signal of said comparator means as a gating signal, and connected to pass the output pulses of said pulse generator means until said coincidence signal is derived.

h. a switching means connected to be actuated in response to the output signals from said gate means, i. oscillator means connected to produce a continuous wave oscillation in response to said switching means, at a frequency considerably higher than the repetitive frequency of the pulses derived from said pulse generator means, for a time interval equal to the pulse duration, and j. a radiator means for transmitting the output signals of said oscillator means toward said receiver, and said pulse signal receiver comprisies:

k. a receiving element adapted to receiving said transmitted signals, l. a detector means for detecting the output of said receiving element, m. a counter means for counting the pulses of the output of said detector means, and for storing said received signals as a binary code, n. a generator means for generating a read-out signal for reading out said stored binary coded signals, and o. a decoder means connected to convert the output of said counter means into a decimal number control signal.

11. A system as defined in claim 10 comprising means for deenergizing said pulse generator means in response to said coincidence signal from said comparator means.

12. A system as defined in claim 10 wherein said pulse generator means comprises a monostable multivibrator controlled in response to said coincidence signal derived from said comparator means, and means applying the output signal of said monostable multivibrator to said AND gate circuit as a gating signal for permitting said pulse generator means to generate said pulses during the time when said code selector means is operated.

13. A system as defined in claim 10 wherein said pulse signal receiver further comprises a. a plurality of frequency discriminator means connected to detect a modulated-pulse signal received from said transmitter, b. a plurality of memory means connected to respectively store each of the output pulses from said plurality of frequency discriminator means, c. a counter means connected to count any output pulses from said plurality of memory means through an or gate connected to each of said plurality of memory means, d. means for converting the output of said counter means into a decimal number signal by said decoder means, and e. a plurality of AND gate means connected to produce an output signal only when the respective output signals from said decoder means and from said plurality of memory means are applied to said AND gate simultaneously.

14. A system as defined in claim 10 wherein said pulse generator means further comprises an RS flip-flop connected to be actuated in response to the output of said decoder means, a switching element connected to be actuated in response to the output of said RS flip-flop, and means for energizing and de-energizing said pulse generator means in response to said switching element, whereby said pulse generator means is actuated in response to the operation of said code selector means.

* * * * *